US012578284B2

(12) United States Patent　　　　　(10) Patent No.:　US 12,578,284 B2

Nie et al.　　　　　　　　　　　　　　(45) Date of Patent:　Mar. 17, 2026

(54) DETECTING DEFECTS IN ARRAY REGIONS ON SPECIMENS

(71) Applicant: KLA Corporation, Milpitas, CA (US)

(72) Inventors: Siqing Nie, Shanghai (CN); Chunwei Song, Shanghai (CN); Chaoqing Wang, Shanghai (CN); Weifeng Zhou, Shanghai (CN); Xiaochun Li, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 489 days.

(21) Appl. No.: 18/160,989

(22) Filed: Jan. 27, 2023

(65) Prior Publication Data

US 2024/0255448 A1　　Aug. 1, 2024

(51) Int. Cl.
　　　*G01N 21/95*　　　(2006.01)
　　　*G01N 23/2251*　　(2018.01)
　　　*H01J 37/22*　　　(2006.01)
　　　*H01J 37/28*　　　(2006.01)

(52) U.S. Cl.
　　　CPC ..... *G01N 21/9501* (2013.01); *G01N 23/2251* (2013.01); *H01J 37/222* (2013.01); *H01J 37/28* (2013.01); *G01N 2223/07* (2013.01); *G01N 2223/6116* (2013.01); *G01N 2223/646* (2013.01); *H01J 2237/221* (2013.01); *H01J 2237/2817* (2013.01)

(58) Field of Classification Search
　　　CPC .......... G01N 21/9501; G01N 23/2251; G01N 2223/07; G01N 2223/6116; G01N 2223/646; H01J 37/222; H01J 37/28; H01J 2237/221; H01J 2237/2817
　　　See application file for complete search history.

(56) References Cited

U.S. PATENT DOCUMENTS

| | | | |
|---|---|---|---|
| 7,397,941 B1 | 7/2008 | Adler et al. |
| 8,126,255 B2 | 2/2012 | Bhaskar et al. |
| 8,664,594 B1 | 3/2014 | Jiang et al. |
| 8,692,204 B2 | 4/2014 | Kojima et al. |
| 8,698,093 B1 | 4/2014 | Gubbens et al. |
| 8,716,662 B1 | 5/2014 | MacDonald et al. |
| 9,222,895 B2 | 12/2015 | Duffy et al. |

(Continued)

OTHER PUBLICATIONS

International Search Report and Written Opinion for PCT/US2024/011712 mailed May 10, 2024.

*Primary Examiner* — Tarifur R Chowdhury
*Assistant Examiner* — Akbar H. Rizvi
(74) *Attorney, Agent, or Firm* — Entropy Matters LLC

(57)　　　　　　　ABSTRACT

Methods and systems for detecting defects in an array region on a specimen are provided. One system includes an inspection subsystem configured for generating output responsive to patterned features formed in an array region on a specimen. The system also includes a computer subsystem configured for determining if a pitch of the patterned features in the output is an integer of pixels in a detector of the inspection subsystem that generated the output. When the pitch is not an integer of the pixels, the computer subsystem is configured for interpolating the output to generate interpolated output having a modified pitch of the patterned features in the interpolated output that is an integer of the pixels. The computer subsystem is also configured for detecting defects in the array region by applying a defect detection method to the interpolated output.

19 Claims, 4 Drawing Sheets

(56) References Cited

U.S. PATENT DOCUMENTS

| | | | |
|---|---|---|---|
| 10,096,100 B2 | 10/2018 | Naka | |
| 2008/0015802 A1* | 1/2008 | Urano | G01N 21/9501 |
| | | | 356/73 |
| 2009/0175530 A1 | 7/2009 | Sjostrom et al. | |
| 2011/0164130 A1* | 7/2011 | Chen | G03F 1/84 |
| | | | 348/126 |
| 2013/0272615 A1* | 10/2013 | Nakamura | G06T 5/70 |
| | | | 382/195 |
| 2015/0278597 A1* | 10/2015 | Amzaleg | G06T 7/001 |
| | | | 382/149 |
| 2020/0194224 A1* | 6/2020 | Stoschus | H01J 37/045 |
| 2021/0208513 A1 | 7/2021 | Javaheri et al. | |
| 2022/0230293 A1* | 7/2022 | Lin | G06T 7/001 |

* cited by examiner

500

502 y x

Computer-readable
medium
600

Program
instructions
602

Computer system
604

DETECTING DEFECTS IN ARRAY REGIONS ON SPECIMENS

BACKGROUND OF THE INVENTION

1. Field of the Invention

The present invention generally relates to methods and systems for detecting defects in an array region on a specimen in the semiconductor arts.

2. Description of the Related Art

The following description and examples are not admitted to be prior art by virtue of their inclusion in this section.

Fabricating semiconductor devices such as logic and memory devices typically includes processing a specimen such as a semiconductor wafer using a number of semiconductor fabrication processes to form various features and multiple levels of the semiconductor devices. For example, lithography is a semiconductor fabrication process that typically involves transferring a pattern to a resist arranged on a semiconductor wafer. Additional examples of semiconductor fabrication processes include, but are not limited to, chemical-mechanical polishing, etch, deposition, and ion implantation. Multiple semiconductor devices may be fabricated in an arrangement on a semiconductor wafer and then separated into individual semiconductor devices.

Inspection using either optical or electron beam imaging is an important technique for debugging semiconductor manufacturing processes, monitoring process variations, and improving production yield in the semiconductor industry. With the ever decreasing scale of modern integrated circuits (ICs) as well as the increasing complexity of the manufacturing process, inspection becomes more and more difficult.

In each processing step performed on a semiconductor wafer, the same circuit pattern is printed in each die. Most wafer inspection systems take advantage of this fact and use a relatively simple die-to-die comparison to detect defects on the wafer. However, the printed circuit in each die may include many areas of patterned features that repeat in the x or y direction such as the areas of DRAM, SRAM, or FLASH. This type of area is commonly referred to as an "array area" (the rest of the areas are called "random" or "logic areas"). To achieve better sensitivity, advanced inspection systems employ different strategies for inspecting the array areas and the random or logic areas.

Array detection algorithms are designed to achieve relatively high sensitivity for DRAM cell regions by making use of the repeatability of the cell region. For example, inspection systems configured for array area inspection often perform a cell-to-cell comparison where images for different cells in an array area in the same die are subtracted from one another and the differences are examined for defects. This array inspection strategy can achieve much higher sensitivity in array areas than random inspection (which is generally performed by subtracting an image for one die from an image for another die) because it avoids noise caused by die-to-die variation.

Currently used cell-to-cell array detection algorithms use neighboring cells as a baseline to generate a reference image for a test cell. Since the pattern is repeating and if its pitch is in integer pixels, neighboring cells should have the same pattern with the test cell if no defect exists. Several neighboring cells can also be selected as a batch, and a median cell can be calculated using the batch of cells. The median cell may be set as the reference cell for all the cells in the batch.

Currently used methods and systems for defect detection in array regions do have a number of important disadvantages. For example, currently used array inspection algorithms require the array region to be repeating in the horizontal dimension. If a wafer has two array regions repeating in two different dimensions, for example, one region repeating in the horizontal dimension and the other region repeating in the vertical dimension, currently used systems need to do 2-pass inspection with different wafer orientations. Currently used array inspection algorithms also require cell pitch to be an integer of the pixels of the detector or in the output, which introduces complexity and extra requirements on the image acquisition system. In addition, currently used algorithms use neighboring cells to generate a reference image for the test cell, but cell-to-cell color variation is not taken into consideration.

Accordingly, it would be advantageous to develop systems and methods for inspection of array regions on specimens that do not have one or more of the disadvantages described above.

SUMMARY OF THE INVENTION

The following description of various embodiments is not to be construed in any way as limiting the subject matter of the appended claims.

One embodiment relates to a system configured for detecting defects in an array region on a specimen. The system includes an inspection subsystem configured for generating output responsive to patterned features formed in an array region on a specimen. The system also includes a computer subsystem configured for determining if a pitch of the patterned features in the output is an integer of pixels in a detector of the inspection subsystem that generated the output. When the pitch is not an integer of the pixels, the computer subsystem is configured for interpolating the output to generate interpolated output having a modified pitch of the patterned features in the output that is an integer of the pixels. The computer subsystem is further configured for detecting defects in the array region by applying a defect detection method to the interpolated output. The system may be further configured as described herein.

Another embodiment relates to a computer-implemented method for detecting defects in an array region on a specimen. The method includes acquiring output responsive to patterned features formed in an array region on a specimen generated by an inspection subsystem. The method also includes determining if a pitch of the patterned features in the output is an integer of pixels in a detector of the inspection subsystem that generated the output. When the pitch is not an integer of the pixels, the method includes interpolating the output to generate interpolated output having a modified pitch of the patterned features in the interpolated output that is an integer of the pixels. The method also includes detecting defects in the array region by applying a defect detection method to the interpolated output. The acquiring, determining, interpolating, and detecting are performed by a computer subsystem coupled to the inspection subsystem. Each of the steps of the method described above may be performed as described further herein. In addition, the embodiment of the method described above may include any other step(s) of any other method(s) described herein. The method described above may be performed by any of the systems described herein.

Another embodiment relates to a non-transitory computer-readable medium storing program instructions executable on a computer system for performing a computer-implemented method for detecting defects in an array region on a specimen. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF DRAWINGS

Further advantages of the present invention will become apparent to those skilled in the art with the benefit of the following detailed description of the preferred embodiments and upon reference to the accompanying drawings in which.

Figure 1:
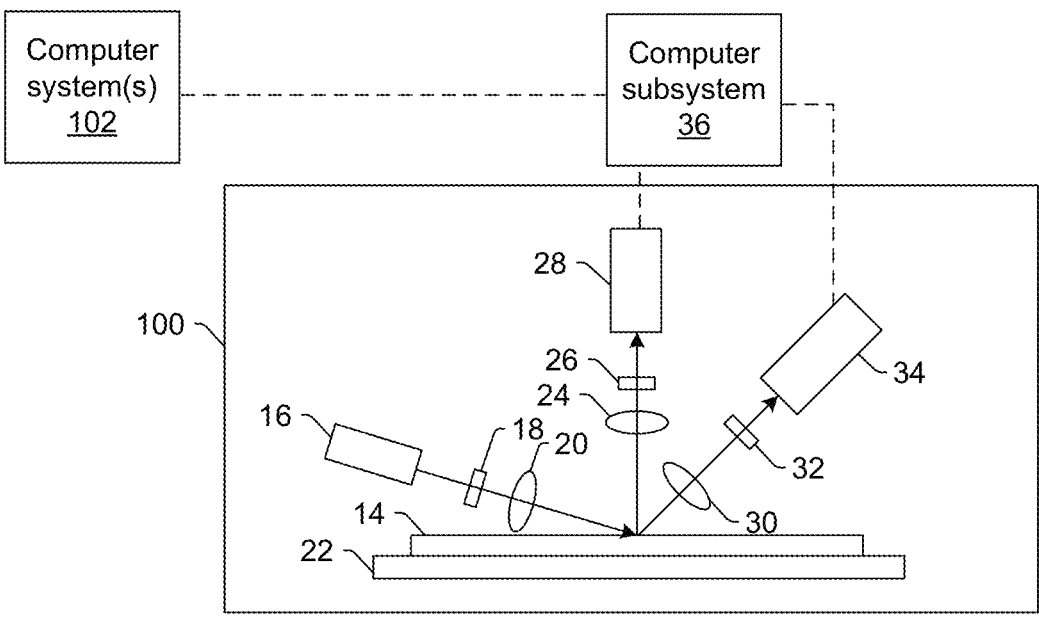
FIGS. 1 and 1a are schematic diagrams illustrating side views of embodiments of a system configured as described herein.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

In general, the embodiments described herein are configured for detecting defects in an array region on a specimen. Defect detection in repeating array regions is an important part of wafer inspection. For repeating patterns, making use of the repeatability to generate a reference image can reduce, and even minimize, the noise introduced by process variation and result in higher detection sensitivity. Currently used detection algorithms for repeating array regions require the pattern to be repeating in the horizontal dimension and the repeating patterned feature pitch to be an integer of the pixels of the detector or in the output. Neighboring cells are used to generate a reference image for the test cell. However, cell-to-cell color variation is not taken into consideration, which can create problems regardless of the location of a cell but especially when the test cell is at the edge of the array region and can be affected by light bleeding. The embodiments described herein provide new cell-to-cell detection systems and methods that can support both horizontally and vertically repeating regions, handle non-integer and non-uniform pitch in the array region, and improve defect detection sensitivity by reducing, and even removing, cell-to-cell color variation.

Although some embodiments are described herein with respect to dynamic random access memory (DRAM) devices, the embodiments described herein can be used for inspection of any type of memory devices and/or devices containing memory regions. In some embodiments, the specimen is a wafer. The wafer may include any wafer known in the semiconductor arts. Although some embodiments may be described herein with respect to a wafer or wafers, the embodiments are not limited in the specimens for which they can be used. For example, the embodiments described herein may be used for specimens such as reticles, flat panels, personal computer (PC) boards, and other semiconductor specimens.

One embodiment of a system configured for detecting defects in an array region on a specimen is shown in FIG. 1. The system includes inspection subsystem 100. In the embodiment shown in FIG. 1, the inspection subsystem is configured as a light-based inspection subsystem. However, in other embodiments described herein, the inspection subsystem is configured as an electron beam or charged particle beam based inspection subsystem.

The inspection subsystem is configured for generating output responsive to patterned features formed in an array region on a specimen. In general, the inspection subsystems described herein include at least an energy source and a detector. The energy source is configured to generate energy that is directed to a specimen. The detector is configured to detect energy from the specimen and to generate output responsive to the detected energy.

In a light-based inspection subsystem, the energy directed to the specimen includes light, and the energy detected from the specimen includes light. For example, in the embodiment of the system shown in FIG. 1, the inspection subsystem includes an illumination subsystem configured to direct light to specimen 14. The illumination subsystem includes at least one light source. For example, as shown in FIG. 1, the illumination subsystem includes light source 16. In one embodiment, the illumination subsystem is configured to direct the light to the specimen at one or more angles of incidence, which may include one or more oblique angles and/or one or more normal angles. For example, as shown in FIG. 1, light from light source 16 is directed through optical element 18 and then lens 20 to specimen 14 at an oblique angle of incidence. The oblique angle of incidence may include any suitable oblique angle of incidence, which may vary depending on, for instance, characteristics of the specimen and the defects to be detected on the specimen.

The illumination subsystem may be configured to direct the light to the specimen at different angles of incidence at different times. For example, the inspection subsystem may be configured to alter one or more characteristics of one or more elements of the illumination subsystem such that the light can be directed to the specimen at an angle of incidence that is different than that shown in FIG. 1. In one such example, the inspection subsystem may be configured to move light source 16, optical element 18, and lens 20 such that the light is directed to the specimen at a different oblique angle of incidence or a normal (or near normal) angle of incidence.

In some instances, the inspection subsystem may be configured to direct light to the specimen at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example in some instances, optical element 18 may be configured as a spectral filter and the properties of the spectral filter can be changed in a variety of different ways (e.g., by swapping out one spectral filter with another) such that different wavelengths of light can be directed to the specimen at different times. The illumination subsystem may have any other suitable configuration known in the art for directing the light having different or the same characteristics to the specimen at different or the same angles of incidence sequentially or simultaneously.

Light source 16 may include a broadband plasma (BBP) light source. In this manner, the light generated by the light source and directed to the specimen may include broadband light. However, the light source may include any other suitable light source such as a laser. The laser may include any suitable laser known in the art and may be configured to generate light at any suitable wavelength(s) known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused onto specimen 14 by lens 20. Although lens 20 is shown in FIG. 1 as a single refractive optical element, in practice, lens 20 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more of the elements of the illumination subsystem based on the type of illumination to be used for inspection.

The inspection subsystem may also include a scanning subsystem configured to change the position on the specimen to which the light is directed and from which the light is detected and possibly to cause the light to be scanned over the specimen. For example, the inspection subsystem may include stage 22 on which specimen 14 is disposed during inspection. The scanning subsystem may include any suitable mechanical and/or robotic assembly (that includes stage 22) that can be configured to move the specimen such that the light can be directed to and detected from different positions on the specimen. In addition, or alternatively, the inspection subsystem may be configured such that one or more optical elements of the inspection subsystem perform some scanning of the light over the specimen such that the light can be directed to and detected from different positions on the specimen. In instances in which the light is scanned over the specimen, the light may be scanned over the specimen in any suitable fashion such as in a serpentine-like path or in a spiral path.

The inspection subsystem further includes one or more detection channels. At least one of the detection channel(s) includes a detector configured to detect light from the specimen due to illumination of the specimen by the system and to generate output responsive to the detected light. For example, the inspection subsystem shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, both detection channels are configured to detect scattered light, and the detection channels are configured to detect light that is scattered at different angles from the specimen. However, one or more of the detection channels may be configured to detect another type of light from the specimen (e.g., reflected light).

As further shown in FIG. 1, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 30, element 32, and detector 34 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 1 shows an embodiment of the inspection subsystem that includes two detection channels, the inspection subsystem may include a different number of detection channels (e.g., only one detection channel or two or more detection channels). In one such instance, the detection channel formed by collector 30, element 32, and detector 34 may form one side channel as described above, and the inspection subsystem may include an additional detection channel (not shown) formed as another side channel that is positioned on the opposite side of the plane of incidence. Therefore, the inspection subsystem may include the detection channel that includes collector 24, element 26, and detector 28 and that is centered in the plane of incidence and configured to collect and detect light at scattering angle(s) that are at or close to normal to the specimen surface. This detection channel may therefore be commonly referred to as a "top" channel, and the inspection subsystem may also include two or more side channels configured as described above. As such, the inspection subsystem may include at least three channels (i.e., one top channel and two side channels), and each of the at least three channels has its own collector, each of which is configured to collect light at different scattering angles than each of the other collectors.

As described further above, each of the detection channels included in the inspection subsystem may be configured to detect scattered light. Therefore, the inspection subsystem shown in FIG. 1 may be configured for dark field (DF) inspection of specimens. However, the inspection subsystem may also or alternatively include detection channel(s) that are configured for bright field (BF) inspection of specimens. In other words, the inspection subsystem may include at least one detection channel that is configured to detect light specularly reflected from the specimen. Therefore, the inspection subsystems described herein may be configured for only DF, only BF, or both DF and BF inspection. Although each of the collectors are shown in FIG. 1 as single refractive optical elements, it is to be understood that each of the collectors may include one or more refractive optical element(s) and/or one or more reflective optical element(s).

The one or more detection channels may include any suitable detectors known in the art. For example, the detectors may include photo-multiplier tubes (PMTs), charge coupled devices (CCDs), and time delay integration (TDI) cameras. The detectors may also include non-imaging detectors or imaging detectors. If the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels may be signals or data, but not image signals or image data. In such instances, a computer subsystem such as computer subsystem 36 that forms part of an inspection system with the inspection subsystem may be configured to generate images of the specimen from the non-imaging output of the detectors. However, in other instances, the detectors may be configured as imaging detectors that are configured to generate imaging signals or image data. Therefore, the inspection subsystem may be configured to generate images in a number of ways.

It is noted that FIG. 1 is provided herein to generally illustrate a configuration of an inspection subsystem that may be included in the system embodiments described herein. Obviously, the inspection subsystem configuration described herein may be altered to optimize the performance of the inspection subsystem as is normally performed when designing a commercial inspection system. In addition, the systems described herein may be implemented using an existing inspection system (e.g., by adding functionality described herein to an existing inspection system) such as the 29xx/39xx series of tools that are commercially available from KLA Corp., Milpitas, Calif. For some such systems, the methods described herein may be provided as optional functionality of the inspection system (e.g., in addition to other functionality of the inspection system). Alternatively, the inspection system described herein may be designed "from scratch" to provide a completely new inspection system.

Computer subsystem 36 may be coupled to the detectors of the inspection subsystem in any suitable manner (e.g., via one or more transmission media, which may include "wired" and/or "wireless" transmission media) such that the computer subsystem can receive the output generated by the detectors. Computer subsystem 36 may be configured to perform a number of functions using the output of the detectors as described further herein. The computer subsystem coupled to the inspection subsystem may be further configured as described herein.

The computer subsystem coupled to the inspection subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems. For example, computer subsystem 36 may be coupled to computer system(s) 102 as shown by the dashed line in FIG. 1 by any suitable transmission media, which may include any suitable wired and/or wireless transmission media known in the art. Two or more of such computer subsystems may also be effectively coupled by a shared computer-readable storage medium (not shown).

Although the inspection subsystem is described above as being an optical or light-based inspection subsystem, in another embodiment, the inspection subsystem is configured as an electron beam based inspection subsystem. In an electron beam type inspection subsystem, the energy directed to the specimen includes electrons, and the energy detected from the specimen includes electrons. In one such embodiment shown in FIG. 1*a*, the inspection subsystem includes electron column 122, and the system includes computer subsystem 124 coupled to the inspection subsystem. Computer subsystem 124 may be configured as described above. In addition, such an inspection subsystem may be coupled to another one or more computer subsystems in the same manner described above and shown in FIG. 1.

Figure 1A:
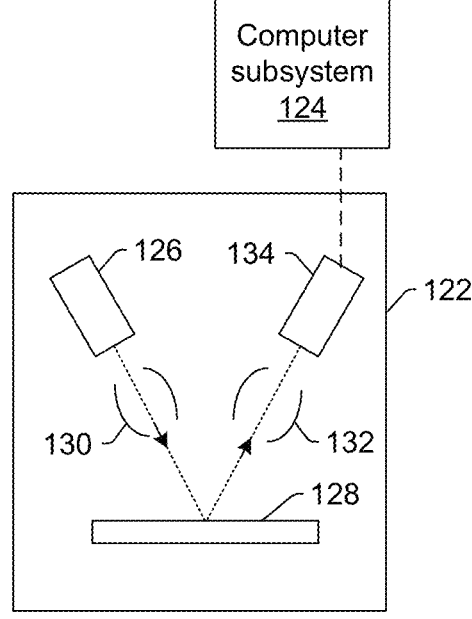

As also shown in FIG. 1*a*, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 1a as being configured such that the electrons are directed to the specimen at an oblique angle of incidence and are scattered from the specimen at another oblique angle, the electron beam may be directed to and scattered from the specimen at any suitable angles. In addition, the electron beam inspection subsystem may be configured to use multiple modes to generate output for the specimen as described further herein (e.g., with different illumination angles, collection angles, etc.). The multiple modes of the electron beam inspection subsystem may be different in any output generation parameters of the inspection subsystem.

Computer subsystem 124 may be coupled to detector 134 as described above. The detector may detect electrons returned from the surface of the specimen thereby forming electron beam images of (or other output for) the specimen. The electron beam images may include any suitable electron beam images. Computer subsystem 124 may be configured to perform any step(s) described herein. A system that includes the inspection subsystem shown in FIG. 1a may be further configured as described herein.

It is noted that FIG. 1a is provided herein to generally illustrate a configuration of an electron beam inspection subsystem that may be included in the embodiments described herein. As with the optical inspection subsystem described above, the electron beam inspection subsystem configuration described herein may be altered to optimize the performance of the inspection subsystem as is normally performed when designing a commercial inspection system. In addition, the systems described herein may be implemented using an existing inspection system (e.g., by adding functionality described herein to an existing inspection system) such as the tools that are commercially available from KLA. For some such systems, the methods described herein may be provided as optional functionality of the system (e.g., in addition to other functionality of the system). Alternatively, the system described herein may be designed "from scratch" to provide a completely new system.

Although the inspection subsystem is described above as being a light or electron beam inspection subsystem, the inspection subsystem may be an ion beam inspection subsystem. Such an inspection subsystem may be configured as shown in FIG. 1a except that the electron beam source may be replaced with any suitable ion beam source known in the art. In addition, the inspection subsystem may include any other suitable ion beam system such as those included in commercially available focused ion beam (FIB) systems, helium ion microscopy (HIM) systems, and secondary ion mass spectroscopy (SIMS) systems.

The inspection subsystems described herein may be configured to generate output, e.g., images, of the specimen with multiple modes. In general, a "mode" is defined by the values of parameters of the inspection subsystem used for generating output and/or images of a specimen (or the output used to generate images of the specimen). Therefore, modes may be different in the values for at least one of the parameters of the inspection subsystem (other than position on the specimen at which the output is generated). For example, in an optical subsystem, different modes may use different wavelength(s) of light for illumination. The modes may be different in the illumination wavelength(s) as described further herein (e.g., by using different light sources, different spectral filters, etc. for different modes). In another example, different modes may use different illumination channels of the optical subsystem. For example, as noted above, the optical subsystem may include more than one illumination channel. As such, different illumination channels may be used for different modes. The modes may also or alternatively be different in one or more collection/detection parameters of the optical subsystem. The modes may be different in any one or more alterable parameters (e.g., illumination polarization(s), angle(s), wavelength(s), etc., detection polarization(s), angle(s), wavelength(s), etc.) of the inspection subsystem. The inspection subsystem may be configured to scan the specimen with the different modes in the same scan or different scans, e.g., depending on the capability of using multiple modes to scan the specimen at the same time.

In a similar manner, the output generated by the electron beam subsystem may include output, e.g., images, generated by the electron beam subsystem with two or more different values of a parameter of the electron beam subsystem. The multiple modes of the electron beam subsystem can be defined by the values of parameters of the electron beam subsystem used for generating output and/or images for a specimen. Therefore, modes may be different in the values for at least one of the electron beam parameters of the electron beam subsystem. For example, different modes may use different angles of incidence for illumination.

As noted above, the inspection subsystem is configured for scanning energy (e.g., light, electrons, etc.) over a physical version of the specimen thereby generating output for the physical version of the specimen. In this manner, the inspection subsystem may be configured as an "actual" subsystem, rather than a "virtual" subsystem. However, a storage medium (not shown) and computer subsystem(s) 102 shown in FIG. 1 may be configured as a "virtual" system. In particular, the storage medium and the computer subsystem(s) may be configured as a "virtual" inspection system as described in commonly assigned U.S. Pat. No. 8,126,255 issued on Feb. 28, 2012 to Bhaskar et al. and U.S. Pat. No. 9,222,895 issued on Dec. 29, 2015 to Duffy et al., both of which are incorporated by reference as if fully set forth herein. The embodiments described herein may be further configured as described in these patents.

Figure 2:
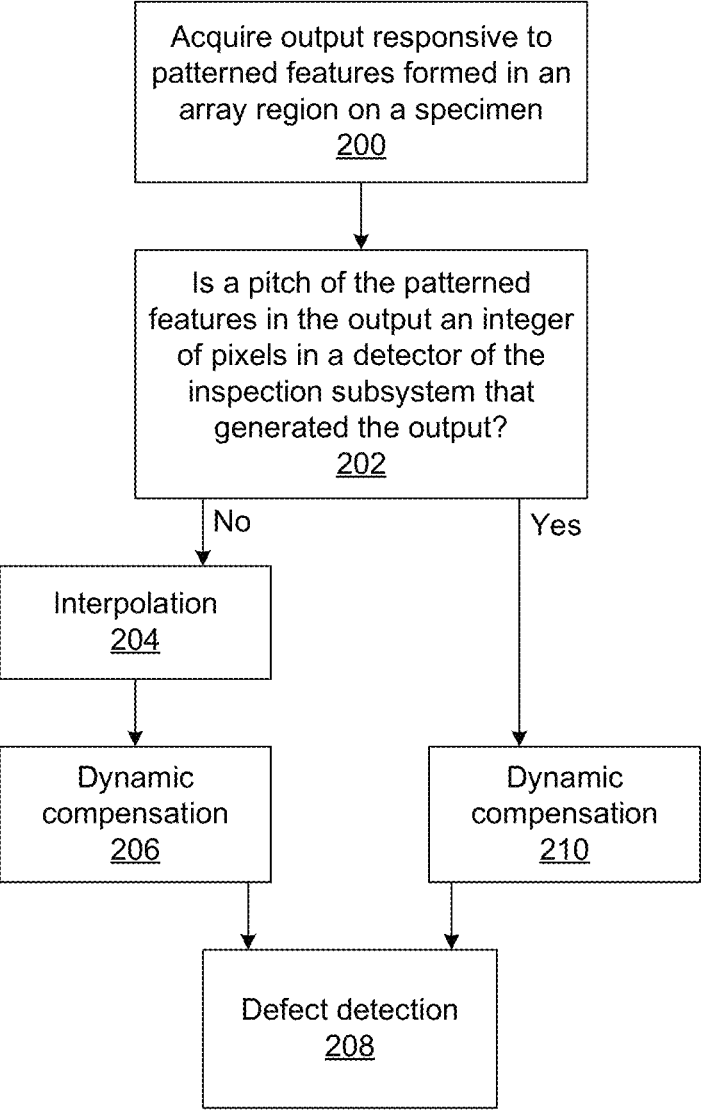
FIG. 2 is a flow chart illustrating an embodiment of steps that may be performed for detecting defects in an array region on a specimen.

As shown in step 200 of FIG. 2, the computer subsystem may acquire output responsive to patterned features formed in an array region on a specimen. Acquiring the output may include generating the output with an inspection subsystem configured as described herein. This output acquisition may be done when the computer subsystem and the inspection subsystem are coupled in one tool and possibly when the defect detection described herein is being performed on-tool and/or as the output is being generated. In other instances, the computer subsystem may acquire the output from another method, system, or storage medium. For example, the computer subsystem and the inspection subsystem may or may not be coupled into a single tool, and the inspection subsystem, the computer subsystem, or another computer subsystem may store the output generated by the inspection subsystem. The computer subsystem may then acquire the output from the storage medium in which it is stored. This output acquisition may be done when the computer subsystem performs the steps described herein off-tool and/or after all (or at least some) of the output has been generated. Each of the elements described above may be configured as described and shown further herein.

In one embodiment, the array region forms part of a memory device being fabricated on the specimen. The memory device may include any memory device known in the art including DRAM. The embodiments described herein propose novel cell-to-cell detection methods to improve array region sensitivity. The embodiments provide several important improvements over currently used systems and methods for array region inspection, which are discussed in detail further herein.

In one embodiment, the patterned features and the inspection subsystem, in combination, cause the output responsive to the patterned features to have repeating and non-constant intensity. For example, the embodiments described herein provide novel inspection methods and systems for resolvable repeating array regions. In terms of the embodiments described herein, "resolvable repeating patterns" does not necessarily mean that the pattern on the specimen is resolvable to the inspection subsystem. In reality, very often, many wafer patterns are only partially resolvable to the inspection subsystem. Instead, in the embodiments described herein, "resolvable" means that the acquired image has repeating and non-constant intensity. In other words, within each unit cell (the basic repeating pattern for array regions), the image gray scale as seen by the inspection subsystem has some variation that is not caused by noise.

As shown in step 202 of FIG. 2, the computer subsystem is configured for determining if a pitch of the patterned features in the output is an integer of pixels in a detector of the inspection subsystem that generated the output. The "pitch of the patterned features in the output" is not necessarily the same as the "pitch of the patterned features on the specimen." For example, for obvious reasons, the pitch of the imaged patterned features can be different than the pitch of the physical patterned features due to the imaging process. The embodiments described herein are primarily concerned with variations in the pitch from an integer of the pixels regardless of the reason for such variations. For example, even if it is possible to create an inspection recipe that would result in the patterned features having a pitch in the output that is an integer of the pixels, variations in the performance of the inspection subsystem can cause the imaged patterned features to have a pitch that is not an integer of the pixels.

Determining if the pitch of the patterned features in the output is an integer of the pixels may be performed in any suitable manner known in the art. As described further herein, the relationship between the pitch of the patterned features and the output pixels may vary from cell-to-cell, which may be caused by, for example, perturbation or drift in the inspection subsystem. Therefore, this determining step may be performed separately and independently for each portion of the output corresponding to a cell in the array region. However, the determining step does not necessarily need to be performed for every cell that is being inspected. For example, the determining step may be performed for the first few cells to establish a relationship between patterned feature pitch and output pixels, and then the determining step may be performed for every x cells thereafter. In particular, while checking the patterned feature pitch to output pixels relationship for each cell may be ideal, in the interest of saving time and money, the determining step may be performed for fewer than all of the cells. The steps described herein that are performed for each of those portions of output may vary then depending on whether or not the pitch of the patterned features in the output is an integer of the pixels.

When repeating areas other than cells are being compared for the defect detection described further herein, the determining step described above may be performed for each of those repeating areas in the same manner. In other words, although the embodiments may be described herein with respect to cell-to-cell detection, the embodiments are not limited to such detection and may be used for defect detection that compares one repeating area to another repeating area. In addition, although the embodiments described herein may be particularly useful for defect detection in array regions, in which all (or nearly all) of the patterned features included therein are designed to have the same pitch, the embodiments described herein are not limited to array region inspection. For example, the determining step described above may be performed using only a portion of the output for a repeating area in which the pitch of the patterned features should be an integer of the pixels. Other steps described further herein, e.g., interpolation and dynamic compensation, may be performed for the entirety of the output generated for that repeating area depending on whether or not the pitch of the patterned features in that portion of the output is an integer of the pixels.

When the pitch is not an integer of the pixels, the computer subsystem is configured for interpolating the output to generate interpolated output having a modified pitch of the patterned features in the interpolated output that is an integer of the pixels. Interpolation is advantageously used by the embodiments described herein to handle non-integer and non-uniform cell pitch. For example, when step 202 in FIG. 2 indicates that the pitch of the patterned features is not an integer of the pixels, the computer subsystem performs interpolation step 204. With interpolation, there is no special limitation in the image acquisition step, and interpolation can reduce the complexity of the system and make the system easier to use. In other words, the system does not have to be configured so that the pitch of the patterned features in the output is an integer of the pixels. In addition, if the pitch of the patterned features in the output becomes a non-integer of the pixels for any reason (e.g., perturbation or drift in the tool), the embodiments described herein can still use that output for defect detection (e.g., after the interpolation step has been performed for that output).

Interpolating the output generally may include interpolating the image gray scale intensity although the interpolation may be performed for any aspect of the inspection subsystem output. Interpolating the output may include any suitable type of interpolation known in the art and may be performed in any suitable manner known in the art. For example, while it is important that "interpolation" should give as accurate a result as possible, there are different interpolation methods. The interpolation method used in the embodiments described herein can be selected based on the desired accuracy and throughput for the embodiments compared to the accuracy and throughput of the various interpolation methods known in the art.

The following, non-limiting example illustrates how and why interpolation is important for the embodiments described herein. Assume the pattern repeating pitch is 10.3 pixels (i.e., a non-integer pitch). Then, ideally, the image gray scale at x=6 pixels and x=16.3 pixels should be the same, and the value at x=16.3 pixels can be used as the reference for the gray scale at x=6 pixels. For all digital images, we only have gray scale values at all integer pixel locations. In other words, the gray scale value at x=16.3 pixels is not available from the input digital image, and it has to be acquired in another way. The inventors have found that interpolation is a quick, easy, and useful way to get the value at non-integer pixel locations such as 16.3 pixels.

In one embodiment, settings of the inspection subsystem used for generating the output are not selected based on a pitch of the patterned features on the specimen or the pitch of the patterned features in the output. For example, in repeating array regions, neighboring cells are used to generate a reference image for a test cell. Usually when the image is acquired, the inspection subsystem is set to make sure the pattern is repeating in the horizontal dimension and the pitch is in integer pixels. With interpolation, there is no special limitation in the image acquisition step, which can reduce the complexity of the system and make the system easier to use.

In another embodiment, the pitch of the patterned features in the output varies from a first repeating area to a second repeating area within the array region due to perturbation in the inspection subsystem. For example, perturbation in the inspection subsystem may result in relatively small pixel size variations and cause non-uniform cell pitch. The embodiments described herein can handle the non-uniform cell pitch case better than currently used array region inspection methods and systems. For example, the steps described herein can be performed on a cell-by-cell (or repeating area-by-repeating area) basis so that even if some cells (or repeating areas) have non-integer pitch, they can still be successfully used for defect detection.

In some embodiments, prior to applying a defect detection method, the computer subsystem is configured for dynamic compensation of the interpolated output responsive to the patterned features in a first repeating area in the array region to the interpolated output or the output responsive to the patterned features in a second repeating area in the array region. As shown in FIG. 2, the results of interpolation step 204 may be input to dynamic compensation step 206. In some array inspection methods, a median cell generated from several neighboring cells may be used as a reference image for a test cell. The median operation helps to reduce some noise and variation between neighboring cells. However, it may not be powerful enough to handle cell-to-cell color variation. The embodiments described herein however can remove cell-to-cell gray scale variation by performing dynamic compensation, which reduces noise and improves sensitivity. For example, dynamic compensation may be performed to correct the color variation between cells. In other words, the dynamic compensation reduces the noise (or difference) between test and reference image as much as possible. In one such example, dynamic compensation may be performed by adjusting the gray scale value of a reference image in a systematic way such that the difference between the test and reference images becomes smaller. Dynamic compensation is performed as a part of image processing and may be performed in any suitable manner known in the art.

In one such embodiment, the dynamic compensation reduces differences between the interpolated output responsive to the patterned features in the first repeating area and the interpolated output or the output responsive to the patterned features in the second repeating area due to color variation on the specimen. For example, dynamic compensation may be used to deal with cell-to-cell color variations by making the reference image more similar to the test image. A better reference image means lower noise and higher detection sensitivity.

Figure 3:
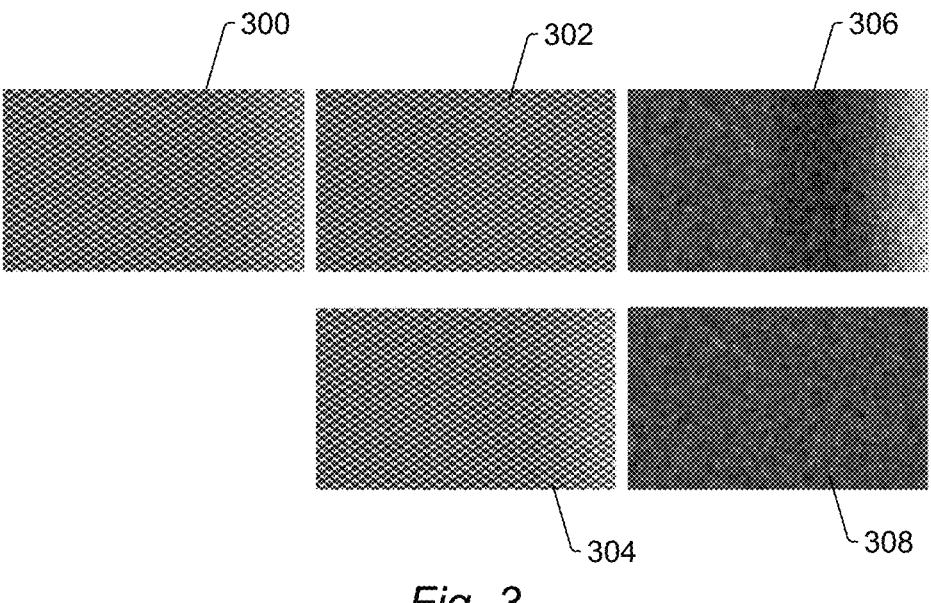
FIG. 3 includes examples of reference and difference images that may be generated for a test image using the embodiments described herein and currently used methods.

FIG. 3 illustrates how the proposed embodiments can handle cell-to-cell color variation and result in a cleaner difference image and higher detection sensitivity. Image 300 is an example of a test image of one SRAM region in which the right edge cells are brighter than the left cells. This brightness variation across the test image may be caused by color variation on the specimen. Images 302 and 306 are the reference and difference images, respectively, created by the currently used method (with no dynamic compensation). As shown by difference image 306, cell-to-cell color variation causes relatively large noise on the difference image, which can then be erroneously detected as defects.

In contrast, images 304 and 308 are the reference and difference images, respectively, created by the proposed embodiments (with dynamic compensation). As can be seen by comparing test image 300 and reference image 304, the color variation that was present between test image 300 and reference image 302 is essentially removed by dynamic compensation. In other words, the brightness variation between test image 300 and reference image 304 is much less than the brightness variation between test image 300 and reference image 302.

In this manner, using reference image 304 for defect detection instead of reference image 302 reduces the effect of the color variation on the inspection. For example, as can be seen by comparing difference image 308, generated by subtracting reference image 304 from test image 300, to difference image 306, generated by subtracting reference image 302 from test image 300, difference image 308 is much cleaner than difference image 306. In other words, difference image 308 contains much less noise than difference image 306. Therefore, any defect detection performed using difference image 308 will detect fewer nuisances than defect detection performed using difference image 306.

"Nuisances" (which is sometimes used interchangeably with "nuisance defects") as that term is used herein is generally defined as events that are detected on a specimen but are not really actual defects on the specimen. Nuisances that are not actually defects may be detected as events due to non-defect noise sources on a specimen (e.g., grain in metal lines on the specimen, signals from underlying layers or materials on the specimen, line edge roughness (LER), relatively small critical dimension (CD) variation in patterned features, thickness variations, etc.) and/or due to marginalities in the inspection system itself or its configuration used for inspection.

The computer subsystem is also configured for detecting defects in the array region by applying a defect detection method to the interpolated output. For example, as shown in FIG. 2, the computer subsystem may perform defect detection step 208 on the results of dynamic compensation step 206. In this manner, the embodiments described herein are capable of inspecting resolvable repeating patterns with non-integer pitch in pixels via the interpolation step described further herein. Applying a defect detection method to the interpolated output may be performed as described further herein or in any other manner known in the art. In addition, the defect detection method may include any defect detection method known in the art such as MDAT, which is a defect detection algorithm used by some inspection systems commercially available from KLA, or another suitable commercially available defect detection method and/or algorithm.

In one embodiment, the defect detection method includes comparing the interpolated output generated for one cell in the array region to the output or interpolated output generated for a different cell in the array region. For example, the defect detection method may include comparing the interpolated output generated for one cell to the interpolated or original output for another cell, and the different cells may be located in the same array region or same die. Comparing the different cells to each other may include generating a difference image. For example, the computer subsystem may generate a difference image such as difference image 308 shown in FIG. 3 by subtracting reference image 304 from test image 300 (thereby essentially comparing the two images).

The reference image and the test image from which it is subtracted may both be generated for the same array region on the specimen (and therefore will necessarily be located in the same die on the specimen). For example, the reference and test images may be images for different cells in the same array region. The reference and test images may also be images for different cells in different array regions when one die includes multiple array regions. Preferably, however, the reference and test images are not images for array regions in different dies since that can introduce noise into the defect detection (since different dies are spaced much farther apart than cells or array regions in the same die, across specimen variations can cause noise in the comparisons; and different dies may be processed separately in one or more steps such as lithography exposure, which can also cause differences in the dies that can produce noise in the comparisons).

The reference image may be the output or interpolated output for an adjacent cell, or the computer subsystem may generate a reference image from the output and/or interpolated output for multiple cells adjacent to or near the test cell. For example, considering the example mentioned above in which the pattern repeats every 10.3 pixels, if x=6 pixels is a test image pixel, by interpolation, the computer subsystem can generate the first reference image pixel for x=16.3 pixels. In a similar manner, the computer subsystem can also get the second reference image pixel for x=26.6 pixels and a third reference image pixel for x=36.9 pixels (by adding the pitch of 10.3 pixels to the test image pixels and then each of the reference image pixels). After multiple reference images are generated by interpolation, the median of such multiple reference images can be generated and used as the final reference image for comparison to the original test image. The defect detection method may also include applying a threshold to the difference image and determining that any pixels in the difference image having a value above the threshold correspond to defects while any pixels in the difference image having a value below the threshold do not correspond to defects.

In one embodiment, when the pitch is an integer of the pixels, the computer subsystem is configured for detecting defects in the array region by applying the defect detection method to the output. For example, the embodiments described herein may always perform the interpolation step described above when the cell pitch is a non-integer number of pixels. However, the interpolation step may be skipped when cell pitch is an integer number of pixels. In one such example, as shown in FIG. 2, when the pitch of the patterned features is determined to be an integer of the pixels in step 202, the output may be input to dynamic compensation step 210 and then defect detection step 208 without any interpolation step being performed on the output. However, the input to the interpolating step described above may be the entire output such as a full digital image, even when the interpolating is performed for less than all of the output (i.e., only portions of the output).

Applying the defect detection method to the output (when no interpolation is required for the output) may otherwise be performed as described herein. In addition, the interpolated output and the output for which interpolation was not performed may be input to the defect detection method collectively. For example, the defect detection method should treat the interpolated output and the non-interpolated output in the same manner. In other words, it should not matter in defect detection whether the input was interpolated or not. Therefore, it should not be necessary for the defect detection method to discriminate between interpolated and non-interpolated output or to treat the interpolated and non-interpolated output differently.

In addition, depending on the repeating area for which the interpolated output or non-interpolated output was generated, the defect detection method may need both interpolated and non-interpolated output for defect detection. For example, for a first cell, interpolation may not be needed and so the test image for that cell used in defect detection may be the original, non-interpolated output. However, the reference for that first cell may be generated from the interpolated output generated for a second cell neighboring the first cell and the original, non-interpolated output generated for a third cell also neighboring the first cell. The defect detection method may then need the interpolated and non-interpolated output generated for the second and third cells, respectively, to generate the reference, subtract the reference from the test image (the non-interpolated output for the first cell), and apply a threshold to the resulting difference image. As can be seen from this example, then, it may be advantageous to provide both interpolated and non-interpolated or original output to the defect detection method so that the defect detection method has any and all of the inputs needed to perform defect detection.

In another embodiment, prior to applying the defect detection method to the output, the computer subsystem is configured for dynamic compensation of the output responsive to the patterned features in a first repeating area in the array region to the interpolated output or the output responsive to the patterned features in a second repeating area in the array region. For example, the embodiments described herein may perform dynamic compensation for the interpolated output as described further above and any output that does not need to be interpolated. In other words, the embodiments described herein may perform dynamic compensation for all output used for inspection without exception regardless of whether the output used for defect detection has been interpolated or not. As shown in FIG. 2, for example, the computer subsystem may perform dynamic compensation step 206 for interpolated output and dynamic compensation step 210 for non-interpolated (or original) output. In general, to simplify the process, the dynamic compensation performed in steps 206 and 210 may be performed in the same manner (e.g., using the same dynamic compensation method or algorithm) although that is not necessary. In addition, although dynamic compensation steps 206 and 210 are shown as separate steps in FIG. 2, the dynamic compensation does not have to be performed separately, and all of the output, interpolated and not, may be input to the same dynamic compensation step. Dynamic compensation 210 may otherwise be performed as described further herein.

In a further embodiment, the dynamic compensation reduces differences between the output responsive to the patterned features in the first repeating area and the interpolated output or the output responsive to the patterned features in the second repeating area due to color variation on the specimen. For example, dynamic compensation step 210 has the same benefits as dynamic compensation step 206 described further above.

When a wafer is loaded onto an inspection tool with a fixed orientation, some patterns are repeating along the x dimension only. Some patterns are repeating along the y dimension only. Some patterns may also repeat along both the x and y dimensions. The dimensions across which the patterns on a wafer repeat is wafer dependent and may vary depending on the design for the wafer. The embodiments described herein have several advantages for specimens that have patterns repeating in two orthogonal dimensions. When an inspection recipe is being setup, a user may indicate whether a pattern is repeating in x, y, or both x and y. The embodiments described herein can then handle different repeating patterns in the same pass or even simultaneously.

In some embodiments, the array region is repeating in a first dimension on the specimen, an additional array region is repeating in a second dimension on the specimen orthogonal to the first dimension, the defect detection method includes comparing repeating areas in the array region to each other and comparing repeating areas in the additional array region to each other, and the determining, interpolating, and detecting steps are performed for the array region and the additional array region using the output generated in a single pass of the specimen by the inspection subsystem. In this way, the embodiments can support both horizontally and vertically repeating array patterns.

Figure 4:
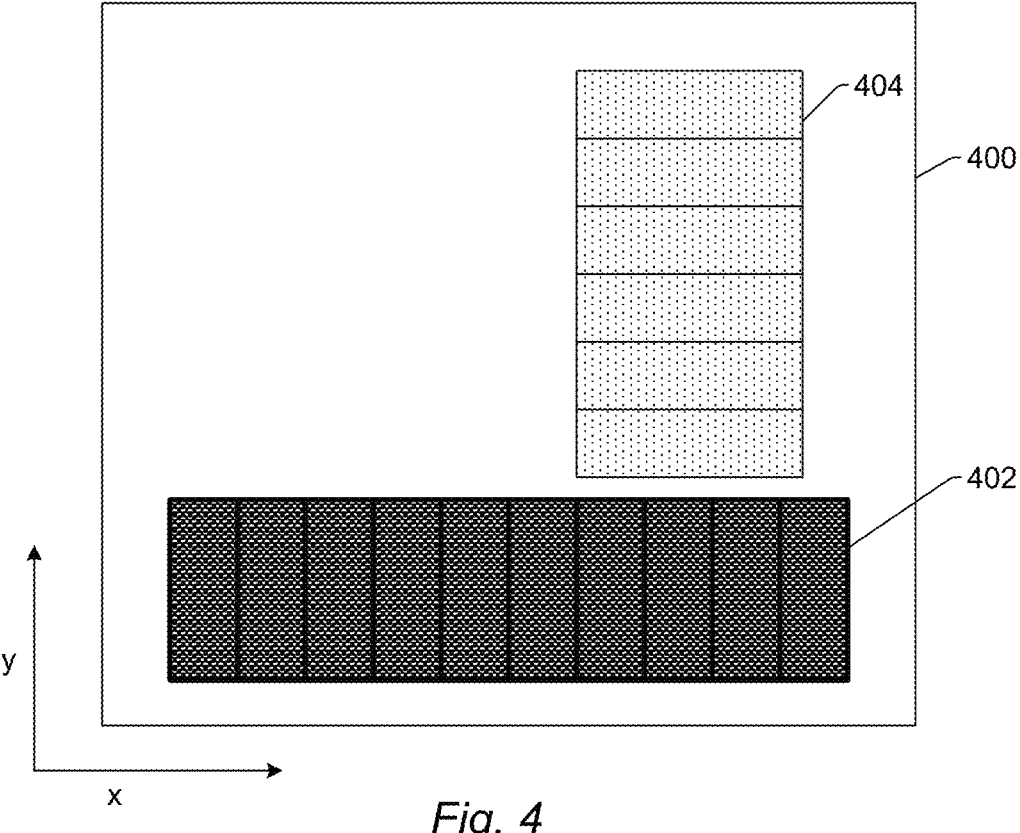
FIG. 4 is a schematic diagram illustrating a plan view of one example of a portion of a specimen that includes array regions repeating in orthogonal dimensions on the specimen.

In one such example, FIG. 4 shows one hypothetical and non-limiting example of portion 400 of a specimen on which array regions 402 and 404 are formed. Array region 402 is repeating in a first dimension, the x dimension, on the specimen, and array region 404 is repeating in a second dimension, the y dimension, on the specimen that is orthogonal to the first dimension. For example, if you consider each of the rectangular regions shown in each of the array regions as a repeating area, then the repeating areas in array region 402 repeat in the x dimension, and the repeating areas in array region 404 repeat in the y dimension. The array regions may also be different in ways other than just the dimensions that they repeat in. For example, array regions 402 and 404 may include different types of patterned features or the same types of patterned features but with one or more different characteristics like size and/or pitch.

Generally speaking though, even if array regions 402 and 404 include the same types of patterned features having all of the same characteristics, the images of the array regions cannot be compared to each other for defect detection because they repeat in different dimensions. In the embodiments described herein, however, the inspection subsystem may generate output for both of the array regions in the same pass of the specimen. In other words, the inspection subsystem does not stop or pause scanning and reposition or re-orient the specimen after one of the array regions has been scanned and before the other array region is scanned. Instead, the output generated for the different array regions in the same scan may be processed separately and independently in other steps described herein. For example, the interpolation, dynamic compensation, and defect detection steps may be performed for one of the array regions using only the output generated for that array region. The interpolation, dynamic compensation, and defect detection steps may then be performed for only the other array region using only the output generated for that other array region. These steps may however, be performed as described further herein regardless of the array region that they are being performed for.

One of the benefits of this capability is that the proposed embodiments do not have array direction limitations. If a specimen has two array regions repeating in different dimensions, with the embodiments described herein, the system does not need to do 2-pass inspection with two different specimen orientations as in currently used systems and methods. The system can finish inspection of two array regions in the same pass, which means the throughput can be 2× compared to currently used systems and methods. The defects detected in different array regions may be reported separately or collectively depending on the preference of the user.

In this manner, with the interpolation step described herein, the embodiments can inspect horizontal and vertical repeating patterns simultaneously in 1 scan pass, which improves throughput by 2×. A DRAM wafer is a good example of why this is useful. In one such embodiment, the array region is a sense amplifier (SA) region of a DRAM array, and the additional array region is a sub-word line driver (SWD) region of the DRAM array. For example, a DRAM wafer usually has repeating SA and SWD regions. However, SA and SWD are always orthogonal to each other. In currently used systems and methods, such a wafer is loaded, one of those regions is inspected, the wafer is then unloaded and rotated followed by inspection of the other region. In the embodiments described herein, however, inspection of the SA and SWD regions can be performed in 1 pass as long as the optical mode permits doing so. In other words, as long as the output for inspection of both regions can be generated in the same pass, whether that means using only a single mode or multiple modes simultaneously, the regions repeating in orthogonal directions can be inspected with that output by the embodiments described herein.

In another embodiment, the array region is repeating in a first dimension on the specimen and a second dimension on the specimen orthogonal to the first dimension, the defect detection method includes comparing a first repeating area in the array region to second and third repeating areas in the array region, the first and second repeating areas repeat in the first dimension, and the first and third repeating areas repeat in the second dimension. In this way, the embodiments can support both horizontally and vertically repeating array patterns.

Figures 5, 6:
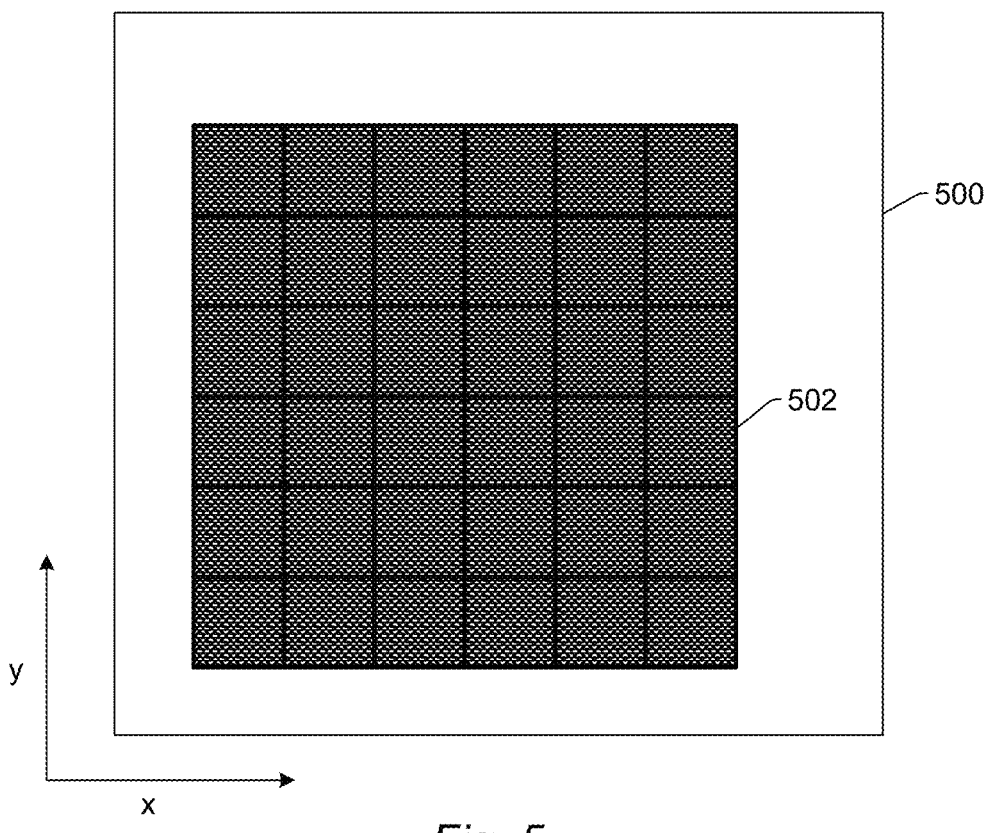
FIG. 5 is a schematic diagram illustrating a plan view of one example of a portion of a specimen that includes an array region that is repeating in orthogonal dimensions on the specimen.
FIG. 6 is a block diagram illustrating one embodiment of a non-transitory computer-readable medium storing program instructions for causing a computer system to perform a computer-implemented method described herein.

In one such example, FIG. 5 shows one hypothetical and non-limiting example of portion 500 of a specimen on which array region 502 is formed. Array region 502 is repeating in a first dimension, the x dimension, on the specimen, and a second dimension, the y dimension, on the specimen that is orthogonal to the first dimension. For example, if you consider each of the square regions shown in array region 502 as a repeating area, then the repeating areas in array region 502 repeat in the x and y dimensions.

For such an array region, the defect detection performed by the embodiments described herein may include comparing the output (interpolated or not) generated for a first of the repeating areas (e.g., a cell) with at least one other repeating area to the left and/or right of it and comparing the output (interpolated or not) for the first of the repeating areas with at least one other repeating area above and/or below it. Each of these comparisons may include subtracting the reference image (from the repeating area other than the first repeating area) from the test image for the first repeating area to thereby generate a difference image.

In some instances, a reference image for the first comparison (in the first repeating dimension) may be generated from the output generated for more than one repeating area in the first repeating dimension. For example, for a test cell in the first row of cells repeating in the x dimension, a median reference cell may be generated from all of the other cells in that first row. A reference image may or may not be generated for the second comparison (in the second repeating dimension) from output generated for more than one repeating area in the second repeating dimension. For example, for a test cell in the first column of cells repeating in the y dimension, a median reference cell may be generated from all of the other cells in that first column. Alternatively, for a test cell in the first column of cells repeating in the y dimension, a single, adjacent cell in the first column may be used as the reference cell. In this manner, the reference images used for the comparisons performed for different repeating dimensions may or may not be generated in the same way. Other parameters of defect detection performed for cells repeating in different dimensions may also be different or the same.

In one such embodiment, the defect detection method includes determining that a defect is present at a location in the first repeating area only when results of comparing the first repeating area to both of the second and third repeating areas indicate the presence of the defect at the location. In this manner, the embodiments described herein can be configured for double detection in which each detection is performed in a different repeating dimension. For example, as described above, a first difference image may be generated for a test cell from the test cell and at least one other cell that repeats in a first dimension, and a second difference image may be generated for the test cell from the test cell and at least one other cell that repeats in a second dimension. A threshold may then be applied to both of the first and second difference images. A defect may be reported at a location in the test cell only when the first and second difference images have values above the threshold at a corresponding location. One of the benefits of this capability is that when array regions repeat in horizontal and vertical dimensions simultaneously, the proposed embodiments can generate two reference images by making use of the horizontal and vertical repeatability. Double detection can be used, and nuisance can be further repressed.

The computer subsystem may generate inspection results, which may include the results of any of the steps described herein. The inspection results may include information for the detected defects such as defect IDs, location, etc., of the bounding boxes of the detected defects, sizes, detection scores, information about defect classifications such as class labels or IDs, etc., or any such suitable information known in the art. The results for the defects may be generated by the computer subsystem in any suitable manner. The results for the defects may have any suitable form or format such as a standard file type. The computer subsystem may generate the results and store the results such that the results can be used by the computer subsystem and/or another system or method to perform one or more functions for the specimen or another specimen of the same type.

The computer subsystem may be configured for storing the information for the detected defects in any suitable computer-readable storage medium. The information may be stored with any of the results described herein and may be stored in any manner known in the art. The storage medium may include any storage medium described herein or any other suitable storage medium known in the art. After the information has been stored, the information can be accessed in the storage medium and used by any of the method or system embodiments described herein, formatted for display to a user, used by another software module, method, or system, etc.

Results and information generated by performing the inspection on the specimen may be used in a variety of manners by the embodiments described herein and/or other systems and methods. Such functions include, but are not limited to, altering a process such as a fabrication process or step that was or will be performed on the inspected specimen or another specimen in a feedback or feedforward manner. For example, the computer subsystem may be configured to determine one or more changes to a process that was or will be performed on a specimen inspected as described herein based on the detected defect(s). The changes to the process may include any suitable changes to one or more parameters of the process. The computer subsystem preferably determines those changes such that the defects can be reduced or prevented on other specimens on which the revised process is performed, the defects can be corrected or eliminated on the specimen in another process performed on the specimen, the defects can be compensated for in another process performed on the specimen, etc. The computer subsystem may determine such changes in any suitable manner known in the art.

Those changes can then be sent to a semiconductor fabrication system (not shown) or a storage medium (not shown) accessible to the computer subsystem and the semiconductor fabrication system. The semiconductor fabrication system may or may not be part of the system embodiments described herein. For example, the computer subsystem and/or inspection subsystem described herein may be coupled to the semiconductor fabrication system, e.g., via one or more common elements such as a housing, a power supply, a specimen handling device or mechanism, etc. The semiconductor fabrication system may include any semiconductor fabrication system known in the art such as a lithography tool, an etch tool, a chemical-mechanical polishing (CMP) tool, a deposition tool, and the like.

The embodiments described herein have a number of advantages over other methods and systems for detecting defects in an array region on a specimen. For example, the embodiments described herein can deal with non-integer and non-uniform pitch in repeating array regions. In addition, the embodiments described herein can remove cell-to-cell color variations between test and reference images. Furthermore, when the specimen has two different array regions repeating in different dimensions, the embodiments described herein can reduce the 2-pass inspection currently used into a 1-pass inspection thereby resulting in 2× throughput. In an additional example, when the array region is repeating in horizontal and vertical dimensions simultaneously, double detection can help further suppress nuisances.

The advantages described above are enabled by a number of important new features of the embodiments described herein. For example, the embodiments described herein provide a new reference generation and defect detection approach for resolvable repeating array regions to improve detection sensitivity in inspection of the array regions. One new feature of the embodiments described herein is using interpolation to handle non-integer and non-uniform cell pitch. Another new feature of the embodiments described herein is using dynamic compensation to remove cell-to-cell color variation. An additional new feature of the embodiments described herein is supporting detection for both vertically and horizontally repeating array regions. Yet another new feature of the embodiments described herein is using double detection to suppress nuisance when an array region is repeating in both horizontal and vertical dimensions simultaneously.

Each of the embodiments of the system described above may be combined together into one single embodiment. In other words, unless otherwise noted herein, none of the system embodiments are mutually exclusive of any other system embodiments.

Another embodiment relates to a computer-implemented method for detecting defects in an array region on a specimen. The method includes acquiring output responsive to patterned features formed in an array region on a specimen generated by an inspection subsystem. The method also includes determining if a pitch of the patterned features in the output is an integer of pixels in a detector of the inspection subsystem that generated the output. When the pitch is not an integer of the pixels, the method includes interpolating the output to generate interpolated output having a modified pitch of the patterned features in the interpolated output that is an integer of the pixels. The method further includes detecting defects in the array region by applying a defect detection method to the interpolated output. The acquiring, determining, interpolating, and detecting steps are performed by a computer subsystem coupled to the inspection subsystem, which may be configured according to any of the embodiments described herein.

Each of the steps of the method may be performed as described further herein. The method may also include any other step(s) that can be performed by the inspection subsystem and/or computer subsystem(s) described herein. In addition, the method described above may be performed by any of the system embodiments described herein.

An additional embodiment relates to a non-transitory computer-readable medium storing program instructions executable on a computer system for performing a computer-implemented method for detecting defects in an array region on a specimen. One such embodiment is shown in FIG. 6. In particular, as shown in FIG. 6, non-transitory computer-readable medium 600 includes program instructions 602 executable on computer system 604. The computer-implemented method may include any step(s) of any method(s) described herein.

Program instructions 602 implementing methods such as those described herein may be stored on computer-readable medium 600. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 604 may be configured according to any of the embodiments described herein.

Further modifications and alternative embodiments of various aspects of the invention will be apparent to those skilled in the art in view of this description. For example, methods and systems for detecting defects in an array region on a specimen are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain attributes of the invention may be utilized independently, all as would be apparent to one skilled in the art after having the benefit of this description of the invention. Changes may be made in the elements described herein without departing from the spirit and scope of the invention as described in the following claims.

The invention claimed is:

1. A system configured for detecting defects in an array region on a specimen, comprising:
an inspection subsystem configured for generating output responsive to patterned features formed in an array region on a specimen; and
a computer subsystem configured for:
determining if a pitch of the patterned features in the output is an integer of pixels in a detector of the inspection subsystem that generated the output;
when the pitch is not an integer of the pixels, interpolating the output to generate interpolated output having a modified pitch of the patterned features in the interpolated output that is an integer of the pixels;
dynamically compensating the interpolated output responsive to the patterned features in a first repeating area in the array region to the interpolated output or the output responsive to the patterned features in a second repeating area in the array region; and
detecting defects in the array region by applying a defect detection method to the interpolated and dynamically compensated output.

2. The system of claim 1, wherein the patterned features and the inspection subsystem, in combination, cause the output responsive to the patterned features to have repeating and non-constant intensity.

3. The system of claim 1, wherein the defect detection method comprises comparing the output generated for one cell in the array region to the output generated for a different cell in the array region.

4. The system of claim 1, wherein settings of the inspection subsystem used for said generating are not selected based on a pitch of the patterned features on the specimen or the pitch of the patterned features in the output.

5. The system of claim 1, wherein the pitch of the patterned features in the output varies from the first repeating area to the second repeating area within the array region due to perturbation in the inspection subsystem.

6. The system of claim 1, wherein the dynamically compensating reduces differences between the interpolated output responsive to the patterned features in the first repeating area and the interpolated output or the output responsive to the patterned features in the second repeating area due to color variation on the specimen.

7. The system of claim 1, wherein when the pitch is an integer of the pixels, the computer subsystem is further configured for detecting defects in the array region by applying the defect detection method to the output.

8. The system of claim 7, wherein prior to applying the defect detection method to the output, the computer subsystem is further configured for dynamic compensation of the output responsive to the patterned features in the first repeating area in the array region to the interpolated output or the output responsive to the patterned features in the second repeating area in the array region.

9. The system of claim 8, wherein the dynamic compensation reduces differences between the output responsive to the patterned features in the first repeating area and the interpolated output or the output responsive to the patterned features in the second repeating area due to color variation on the specimen.

10. The system of claim 1, wherein the array region is repeating in a first dimension on the specimen, wherein an additional array region is repeating in a second dimension on the specimen orthogonal to the first dimension, wherein the defect detection method comprises comparing repeating areas in the array region to each other and comparing repeating areas in the additional array region to each other, and wherein said determining, interpolating, and detecting are performed for the array region and the additional array region using the output generated in a single pass of the specimen by the inspection subsystem.

11. The system of claim 10, wherein the array region is a sense amplifier region of a dynamic random access memory array, and wherein the additional array region is a sub-word line driver region of the dynamic random access memory array.

12. The system of claim 1, wherein the array region is repeating in a first dimension on the specimen and a second dimension on the specimen orthogonal to the first dimension, wherein the defect detection method comprises comparing the first repeating area in the array region to the second and a third repeating areas in the array region, wherein the first and second repeating areas repeat in the first dimension, and wherein the first and third repeating areas repeat in the second dimension.

13. The system of claim 12, wherein the defect detection method further comprises determining that a defect is present at a location in the first repeating area only when results of the comparing the first repeating area to both of the second and third repeating areas indicate the presence of the defect at the location.

14. The system of claim 1, wherein the array region forms part of a memory device being fabricated on the specimen.

15. The system of claim 1, wherein the specimen comprises a wafer.

16. The system of claim 1, wherein the inspection subsystem is further configured as a light-based inspection subsystem.

17. The system of claim 1, wherein the inspection subsystem is further configured as an electron beam based inspection subsystem.

18. A non-transitory computer-readable medium, storing program instructions executable on a computer system for performing a computer-implemented method for detecting defects in an array region on a specimen, wherein the computer-implemented method comprises:

acquiring output responsive to patterned features formed in an array region on a specimen generated by an inspection subsystem;

determining if a pitch of the patterned features in the output is an integer of pixels in a detector of the inspection subsystem that generated the output;

when the pitch is not an integer of the pixels, interpolating the output to generate interpolated output having a modified pitch of the patterned features in the interpolated output that is an integer of the pixels;

dynamically compensating the interpolated output responsive to the patterned features in a first repeating area in the array region to the interpolated output or the output responsive to the patterned features in a second repeating area in the array region; and detecting defects in the array region by applying a defect detection method to the interpolated and dynamically compensated output.

19. A computer-implemented method for detecting defects in an array region on a specimen, comprising:

acquiring output responsive to patterned features formed in an array region on a specimen generated by an inspection subsystem;

determining if a pitch of the patterned features in the output is an integer of pixels in a detector of the inspection subsystem that generated the output;

when the pitch is not an integer of the pixels, interpolating the output to generate interpolated output having a modified pitch of the patterned features in the interpolated output that is an integer of the pixels;

dynamically compensating the interpolated output responsive to the patterned features in a first repeating area in the array region to the interpolated output or the output responsive to the patterned features in a second repeating area in the array region; and detecting defects in the array region by applying a defect detection method to the interpolated and dynamically compensated output, wherein said acquiring, determining, interpolating, dynamically compensating, and detecting are performed by a computer subsystem coupled to the inspection subsystem.

* * * * *